(12) United States Patent
Weng et al.

(10) Patent No.: US 8,165,258 B2
(45) Date of Patent: Apr. 24, 2012

(54) CLOCK GENERATING DEVICE AND METHOD THEREOF

(75) Inventors: Meng-Chih Weng, Tainan County (TW); Kuo-Chan Huang, Tainan County (TW)

(73) Assignee: Himax Technologies Limited, Fonghua Village, Xinshi Dist., Tainan (TW)

( * ) Notice: Subject to any disclaimer, the term of this patent is extended or adjusted under 35 U.S.C. 154(b) by 850 days.

(21) Appl. No.: 12/189,204

(22) Filed: Aug. 11, 2008

(65) Prior Publication Data

US 2010/0034330 A1 Feb. 11, 2010

(51) Int. Cl.
*H03D 3/24* (2006.01)
(52) U.S. Cl. ........ 375/376; 375/326; 375/327; 375/373; 327/156; 455/260
(58) Field of Classification Search .................. 375/326, 375/327, 373, 376; 455/260; 327/156
See application file for complete search history.

(56) References Cited

U.S. PATENT DOCUMENTS

| | | | | |
|---|---|---|---|---|
| 6,307,413 | B1 * | 10/2001 | Dalmia et al. | 327/166 |
| 6,310,521 | B1 * | 10/2001 | Dalmia | 331/11 |
| 7,089,444 | B1 * | 8/2006 | Asaduzzaman et al. | 713/600 |
| 2007/0035333 | A1 | 2/2007 | Nguyen | |

* cited by examiner

*Primary Examiner* — Ted Wang
(74) *Attorney, Agent, or Firm* — Winston Hsu; Scott Margo

(57) ABSTRACT

A clock generating device includes: a frequency divider having an input node coupled to a transmission interface for generating a reference clock signal according to an input data received from the transmission interface; and a clock/data recovery circuit having a data input node coupled to the transmission interface and a reference clock input node coupled to an output node of the frequency divider, for generating an output clock signal according to one of the input data received at the data input node and the reference clock signal received at the reference clock input node.

8 Claims, 3 Drawing Sheets

CLOCK GENERATING DEVICE AND METHOD THEREOF

BACKGROUND OF THE INVENTION

1. Field of the Invention

The present invention relates to a clock generating device, and more particularly, to a clock/data recovery circuit that does not utilize an oscillating device to generate an input reference clock, and a method thereof.

2. Description of the Prior Art

Please refer to FIG. 1. FIG. 1 is a diagram illustrating a clock/data recovery circuit 100 according to the prior art. The clock/data recovery circuit 100 has a frequency input node $N_{FREQ}$ for receiving a reference clock signal $F_{REF}$ to generate an output clock signal $F_{OSC}$ at an output node $N_{OSC}$, and a data input node $N_{data}$ for receiving an input data $D_D$. The clock/data recovery circuit 100 comprises a phase detector 102, a multiplexer 104, a charge pump circuit 106, a low pass filter 108, a voltage controlled oscillator (VCO) 110, a phase/frequency detector 112, a lock detecting circuit 114, and a frequency divider 116. Please note that the connectivity between the components of the clock/data recovery circuit 100 is shown in FIG. 1. Normally, the clock/data recovery circuit 100 can be viewed as a two-loops device, where the first loop consists of the phase/frequency detector 112, the multiplexer 104, the charge pump circuit 106, the low pass filter 108, the voltage controlled oscillator 110, and the frequency divider 116, and the second loop consists of the phase detector 102, the multiplexer 104, the charge pump circuit 106, the low pass filter 108, and the voltage controlled oscillator 110.

The first loop is coupled to the reference clock signal $F_{REF}$ for locking the frequency of the reference clock signal $F_{REF}$ to generate the output clock signal $F_{OSC}$ at a desired output frequency. When the frequency of the reference clock signal $F_{REF}$ is locked on, the oscillating frequency of the voltage controlled oscillator 110 will substantially be equal to the frequency of the input data $D_D$. Then, the first loop will be terminated and the second loop activated at the same time. The second loop is utilized to lock the phase of the input data $D_D$ under the oscillating frequency determined by the first loop. Therefore, an oscillating device 118 is necessary for generating the reference clock signal $F_{REF}$ in the prior art clock/data recovery circuit 100. This oscillating device 118, however, increases the manufacturing cost of the clock/data recovery circuit 100.

SUMMARY OF THE INVENTION

Therefore, one of the objectives of the present invention is to provide a clock/data recovery circuit that does not utilize an oscillating device for generating an input reference clock, and a method thereof.

According to an embodiment of the present invention, a clock generating device is provided. The clock generating device comprises a frequency divider and a clock/data recovery circuit. The frequency divider has an input node coupled to a transmission interface for generating a reference clock signal according to an input data received from the transmission interface. The clock/data recovery circuit has a data input node coupled to the transmission interface and a reference clock input node coupled to an output node of the frequency divider for generating an output clock signal according to one of the input data received at the data input node and the reference clock signal received at the reference clock input node.

According to another embodiment of the present invention, a clock generating method of a clock/data recovery circuit is provided. The clock generating method comprises the steps of: generating a reference clock signal by performing a frequency dividing operation upon an input data received from a transmission interface; and utilizing the clock/data recovery circuit to generate an output clock signal according to one of the input data and the reference clock signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
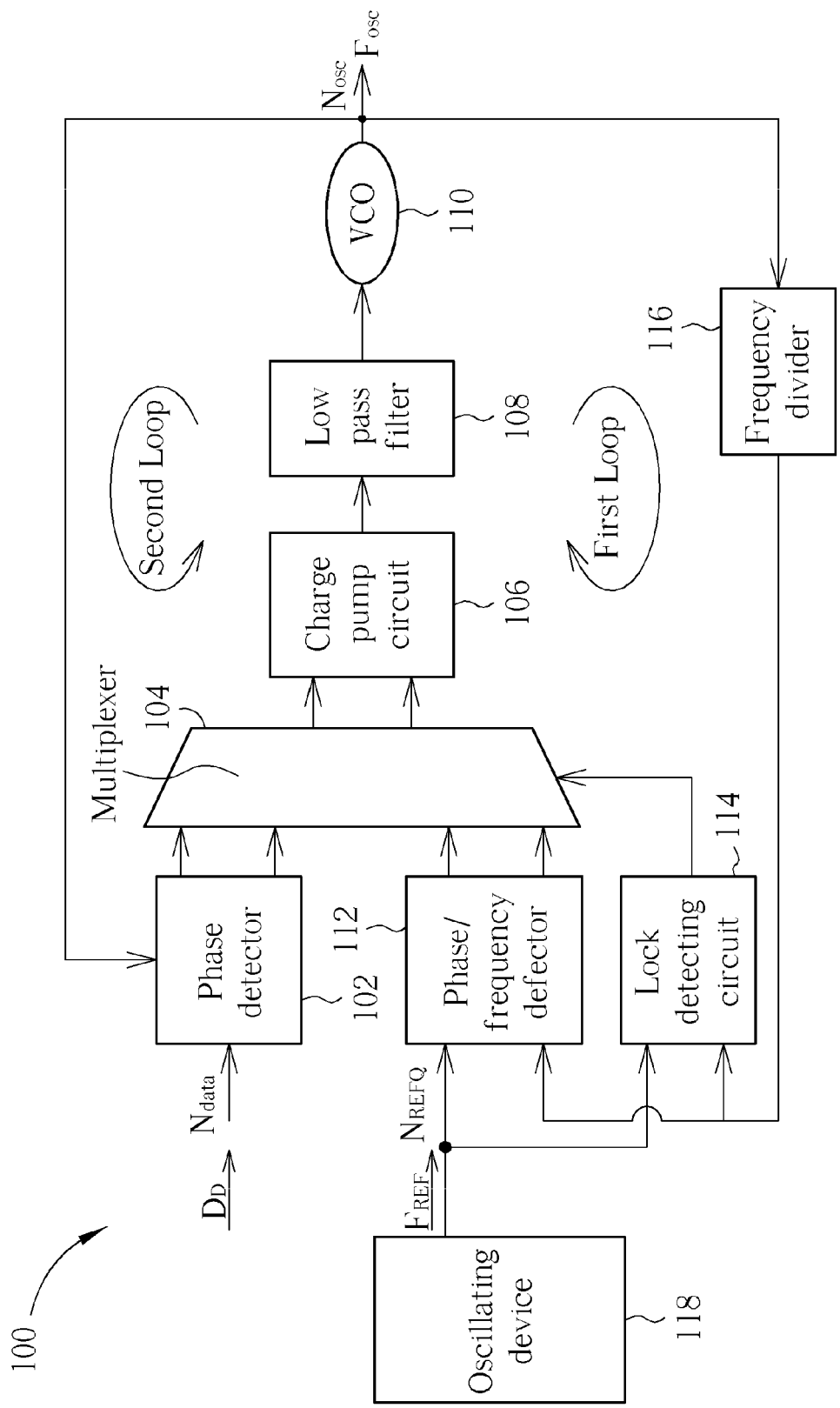
FIG. 1 is a diagram illustrating a prior art clock/data recovery circuit.
Figure 2:
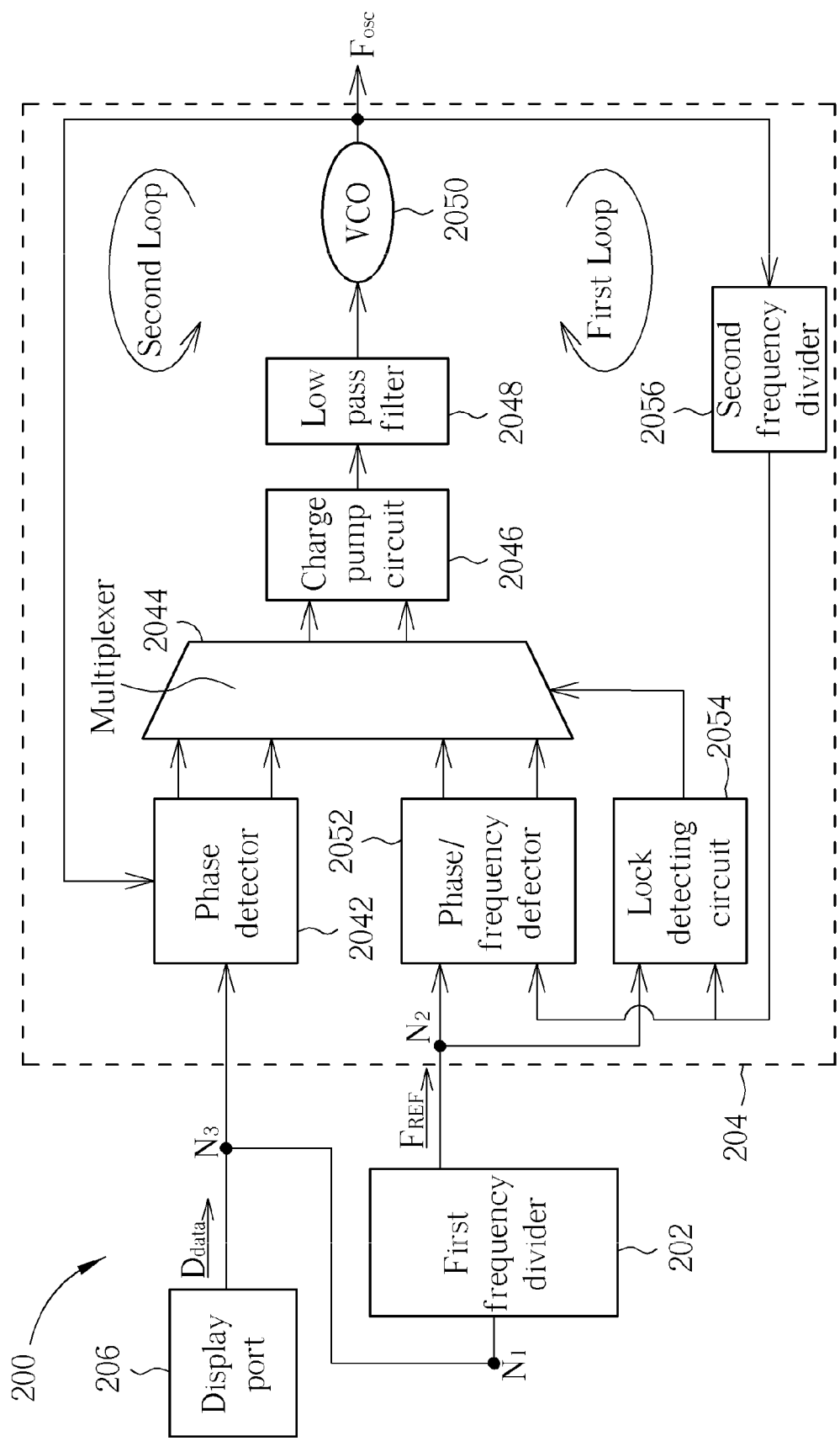
FIG. 2 is a diagram illustrating a clock generating device according to an embodiment of the present invention.

Please refer to FIG. 2. FIG. 2 is a diagram illustrating a clock generating device 200 according to an embodiment of the present invention. The clock generating device 200 comprises a first frequency divider 202 and a clock/data recovery circuit 204. The first frequency divider 202 has an input node $N_1$ coupled to a Display Port 206 for generating a reference clock signal $F_{REF}$ according to an input data $D_{data}$ received from the Display Port 206. The clock/data recovery circuit 204 has a data input node $N_3$ coupled to the Display Port 206 and a reference clock input node coupled to an output node $N_2$ of the first frequency divider 202 for generating an output clock signal $F_{OUT}$ according to one of the input data $D_{data}$ received at the data input node $N_3$ and the reference clock signal $F_{REF}$ received at the reference clock input node $N_2$. The clock/data recovery circuit 204 comprises a phase detector 2042, a multiplexer 2044, a charge pump circuit 2046, a low pass filter 2048, a voltage controlled oscillator (VCO) 2050, a phase/frequency detector 2052, a lock detecting circuit 2054, and a second frequency divider 2056. Please note that the connectivity between the components of the clock/data recovery circuit 204 is shown in FIG. 2, and those skilled in this art should readily understand that the clock/data recovery circuit 204 is a well-known circuit and detailed descriptions of the components of the clock/data recovery circuit 204 are omitted here for brevity. Furthermore, the present invention is not limited to a clock/data recovery circuit only having the above-mentioned components.

According to the specification of the Display Port 206, some signal patterns may be transmitted to the clock/data recovery circuit 204 via the input data $D_{data}$ before a real input data in the input data $D_{data}$ is transmitted to the clock/data recovery circuit 204, i.e., a link training process. One of the signal patterns is the clock recovery (CR) pattern, the CR pattern being utilized for providing a reference clock to an equalizing circuit coupled to the clock/data recovery circuit 204, in which the operation between the equalizing circuit and the clock/data recovery circuit 204 is well known and omitted here for brevity. Since the CR pattern is a pattern of continuous interlacing 1 and 0 signals (i.e., 10101010 . . . ), and will last for about 100 uS in the link training process, the first frequency divider 202 divides the CR pattern to generate the reference clock signal $F_{REF}$ at a desired frequency under a frequency locking mode of the clock generating device 200. Accordingly, the reference clock signal $F_{REF}$ with the desired frequency can be generated to last for about 100 uS without using an oscillator. Then, according to the embodiment of the present invention, the first loop of the clock/data recovery circuit 204 locks the reference clock signal $F_{REF}$ to generate the output clock signal $F_{OUT}$ within the interval of the CR pattern in the link training process, i.e., about 100 uS. When the first loop of the clock/data recovery circuit 204 is locked to the reference clock signal $F_{REF}$, which means that the output clock signal $F_{OUT}$ oscillates under the required frequency, the operation of the first loop can be terminated. Meanwhile, the second loop of the clock/data recovery circuit 204 is activated for locking the real input data in the input data $D_{data}$ received from the Display Port 206 at the input node $N_1$. Those skilled in this art will readily understand that the real input data in the input data $D_{data}$ will not influence the first loop when the first loop is terminated.

Please note that the clock generating device 200 of the present invention is not limited to the Display Port 206; any other transmission interfaces that generate a pattern of continuous interlacing 1 and 0 signals also belong to the scope of the present invention. It should also be noted that those skilled in this art may replace the clock/data recovery circuit 204 with a phase lock loop (PLL) circuit after reading the disclosure of the present invention, and this also falls within the scope of the present invention.

Figure 3:
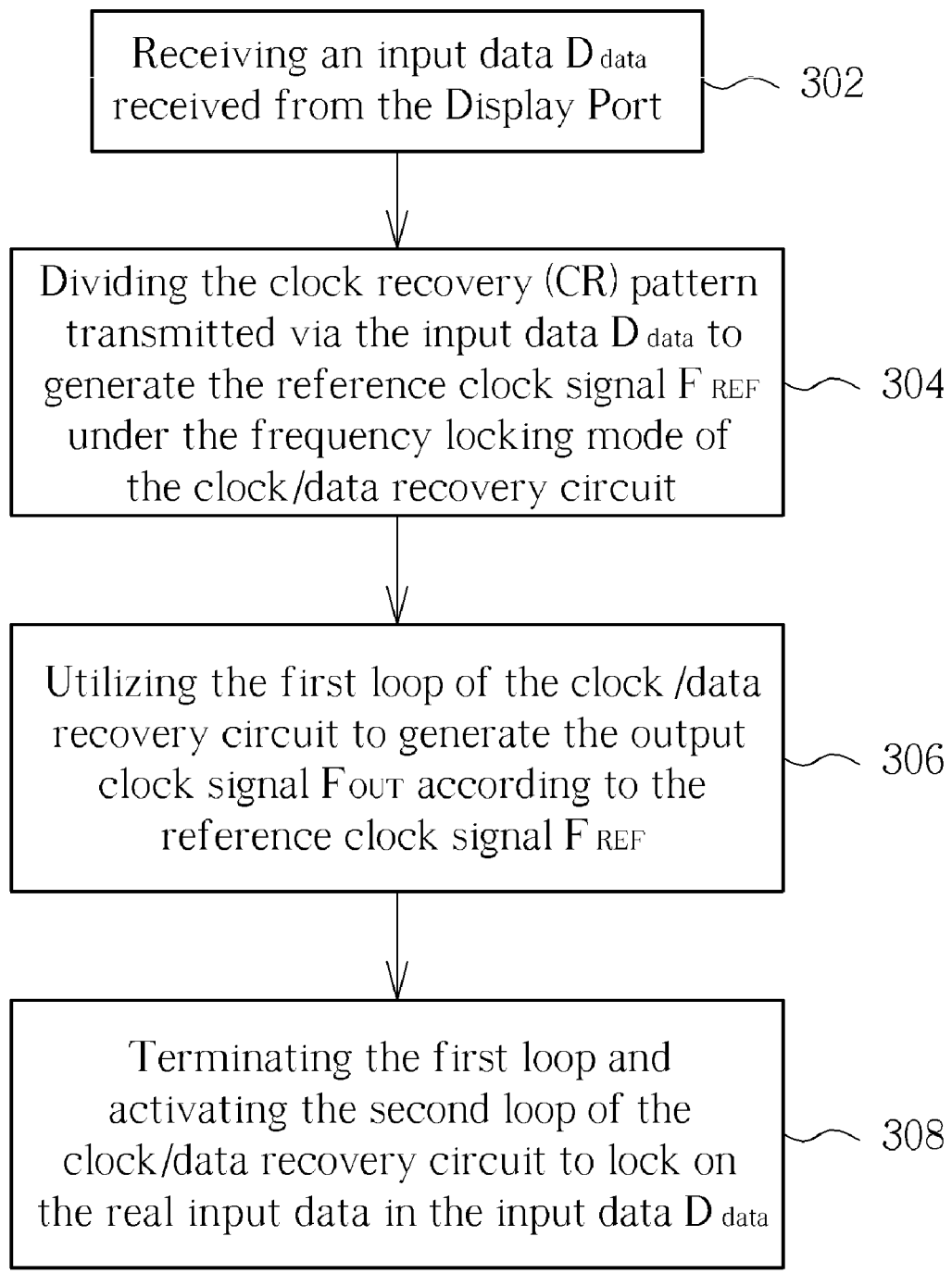
FIG. 3 is a flowchart illustrating a clock generating method of a clock/data recovery circuit according to another embodiment of the present invention.

Please refer to FIG. 3. FIG. 3 is a flowchart illustrating a clock generating method of a clock/data recovery circuit according to another embodiment of the present invention. For brevity, the clock generating method is described in accordance with the clock generating device 200 as shown in FIG. 2. Provided that substantially the same result is achieved, the steps of the flowchart shown in FIG. 3 need not be in the exact order shown and need not be contiguous, that is, other steps can be intermediate. The clock generating method comprises the following steps:

Step 302: Receiving an input data $D_{data}$ received from the Display Port 206;

Step 304: Dividing the clock recovery (CR) pattern transmitted via the input data $D_{data}$ to generate the reference clock signal $F_{REF}$ under the frequency locking mode of the clock/data recovery circuit 204;

Step 306: Utilizing the first loop of the clock/data recovery circuit 204 to generate the output clock signal $F_{OUT}$ according to the reference clock signal $F_{REF}$; and Step 308: Terminating the first loop and activating the second loop of the clock/data recovery circuit 204 to lock on the real input data in the input data $D_{data}$.

In step 302, according to the present invention, the clock generating method is not limited to receive the input data $D_{data}$ from the Display Port 206; any other transmission interfaces that generate a pattern of continuous interlacing high voltage level (1) and low voltage level (0) signals belong to the scope of the present invention. In step 304, the CR pattern is divided to generate the reference clock signal $F_{REF}$ at a desired frequency under the frequency locking mode of the clock generating device 200. Accordingly, the reference clock signal $F_{REF}$ with the desired frequency can be generated to last for about 100 uS without using an oscillator. In step 306, when the first loop of the clock/data recovery circuit 204 locks to the reference clock signal $F_{REF}$, which means that the output clock signal $F_{OUT}$ oscillates under the required frequency, the operation of the first loop is terminated in step 308. Meanwhile, the second loop of the clock/data recovery circuit 204 is activated for locking the real input data in the input data $D_{data}$ received from the Display Port 206 at the input node $N_1$. As in the first embodiment, the clock/data recovery circuit 204 may be replaced with a phase lock loop (PLL) circuit, and this is also within the scope of the present invention.

Those skilled in the art will readily observe that numerous modifications and alterations of the device and method may be made while retaining the teachings of the invention.

What is claimed is:

1. A clock generating device, comprising:
   a frequency divider, having an input node coupled to a transmission interface, for generating a reference clock signal according to an input data received from the transmission interface; and
   a clock/data recovery circuit, having a data input node coupled to the transmission interface and a reference clock input node coupled to an output node of the frequency divider, for generating an output clock signal according to one of the input data received at the data input node and the reference clock signal received at the reference clock input node;
   wherein the frequency divider divides a clock recovery (CR) pattern of the input data to generate the reference clock signal with a desired frequency for the clock/data recovery circuit, and the clock/data recovery circuit locks the reference clock signal to generate the output clock signal within an interval of the CR pattern in a link training process.

2. The clock generating device of claim 1, wherein the input data comprises a pattern of continuous interlacing high voltage level and low voltage level signals.

3. The clock generating device of claim 1, wherein the transmission interface is a Display Port.

4. The clock generating device of claim 1, wherein the frequency divider divides the CR pattern transmitted via the input data to generate the reference clock signal under a frequency locking mode of the clock/data recovery circuit.

5. A clock generating method of a clock/data recovery circuit, comprising:
   generating a reference clock signal by performing a frequency dividing operation upon an input data received from a transmission interface; and
   utilizing the clock/data recovery circuit to generate an output clock signal according to one of the input data and the reference clock signal;
   wherein the frequency dividing operation is to divide a clock recovery (CR) pattern of the input data to generate the reference clock signal with a desired frequency for the clock/data recovery circuit, and the clock/data recovery circuit locks the reference clock signal to generate the output clock signal within an interval of the CR pattern in a link training process.

6. The clock generating method of claim 5, wherein the input data comprises a pattern of continuous interlacing high voltage level and low voltage level signals.

7. The clock generating method of claim 5, wherein the transmission interface is a Display Port.

8. The clock generating method of claim 5, wherein generating the reference clock signal comprises:
   dividing the CR pattern transmitted via the input data to generate the reference clock signal under a frequency locking mode of the clock/data recovery circuit.

* * * * *